United States Patent
Spielberger et al.

(10) Patent No.: US 7,965,094 B2
(45) Date of Patent: Jun. 21, 2011

(54) PACKAGED DIE HEATER

(75) Inventors: Richard Spielberger, Maple Grove, MN (US); Bruce Walker Ohme, Minneapolis, MN (US); Ronald J. Jensen, Bloomington, MN (US)

(73) Assignee: Honeywell International Inc., Morristown, NJ (US)

( * ) Notice: Subject to any disclaimer, the term of this patent is extended or adjusted under 35 U.S.C. 154(b) by 161 days.

(21) Appl. No.: 12/172,317

(22) Filed: Jul. 14, 2008

(65) Prior Publication Data
US 2010/0007367 A1 Jan. 14, 2010

(51) Int. Cl.
*G01R 31/26* (2006.01)
*G01R 31/10* (2006.01)

(52) U.S. Cl. .............................. 324/762.02; 324/750.07

(58) Field of Classification Search ............... 324/158.1, 324/760, 763–765; 438/14–18
See application file for complete search history.

(56) References Cited

U.S. PATENT DOCUMENTS

| | | | | |
|---|---|---|---|---|
| 3,914,639 A * | 10/1975 | Barraco et al. | ................. | 313/271 |
| 4,561,006 A | 12/1985 | Currie | ............................. | 357/28 |
| 4,777,434 A | 10/1988 | Miller | ........................... | 324/158 |
| 4,968,931 A | 11/1990 | Littlebury | ..................... | 324/158 |
| 5,327,075 A | 7/1994 | Hashinaga | ................. | 324/158.1 |
| 5,414,370 A | 5/1995 | Hashinaga | ..................... | 324/760 |
| 5,451,165 A | 9/1995 | Cearley-Cabbiness | ........ | 439/71 |
| 5,945,834 A | 8/1999 | Nakata et al. | | |
| 6,041,729 A | 3/2000 | Alan | ........................... | 114/230.2 |
| 6,666,907 B1 * | 12/2003 | Manginell et al. | ................ | 95/87 |
| 6,696,849 B2 | 2/2004 | Ban | ................................ | 324/760 |
| 6,753,508 B2 | 6/2004 | Shirakawa | ................. | 219/444.1 |
| 7,047,626 B2 | 5/2006 | Clulow | ........................... | 29/611 |
| 7,112,986 B2 | 9/2006 | Wood | ............................ | 324/765 |
| 7,268,322 B2 | 9/2007 | Kuibira | ...................... | 219/444.1 |
| 7,307,247 B2 | 12/2007 | Bower | ......................... | 219/544 |
| 2006/0290370 A1 | 12/2006 | Lopez | | |
| 2007/0030019 A1 | 2/2007 | Kinsley | | |
| 2007/0206654 A1 * | 9/2007 | Merzliakov | ..................... | 374/31 |

FOREIGN PATENT DOCUMENTS

| | | |
|---|---|---|
| JP | 2003 026432 | 1/2003 |
| JP | 2004-206861 | 7/2004 |
| JP | 2005-226440 | 8/2005 |
| WO | WO 02/056073 A1 | 7/2002 |

OTHER PUBLICATIONS

European Search Report from corresponding EP Application No. 09159277.4, mailed Nov. 23, 2009, 3 pages.
European Examination Report from corresponding EP Application No. 09159277.4, mailed Dec. 4, 2009, 3 pages.
European Examination Report from corresponding EP Application No. 09159277.4, mailed Apr. 13, 2010, 4 pages.

* cited by examiner

*Primary Examiner* — Ha Tran T Nguyen
*Assistant Examiner* — Joshua Benitez
(74) *Attorney, Agent, or Firm* — Shumaker & Sieffert, P.A.

(57) ABSTRACT

A heater for heating packaged die for burn-in and heat testing is described. The heater may be a ceramic-type heater with a metal filament. The heater may be incorporated into the integrated circuit package as an additional ceramic layer of the package, or may be an external heater placed in contact with the package to heat the die. Many different types of integrated circuit packages may be accommodated. The method provides increased energy efficiency for heating the die while reducing temperature stresses on testing equipment. The method allows the use of multiple heaters to heat die to different temperatures. Faulty die may be heated to weaken die attach material to facilitate removal of the die. The heater filament or a separate temperature thermistor located in the package may be used to accurately measure die temperature.

20 Claims, 15 Drawing Sheets

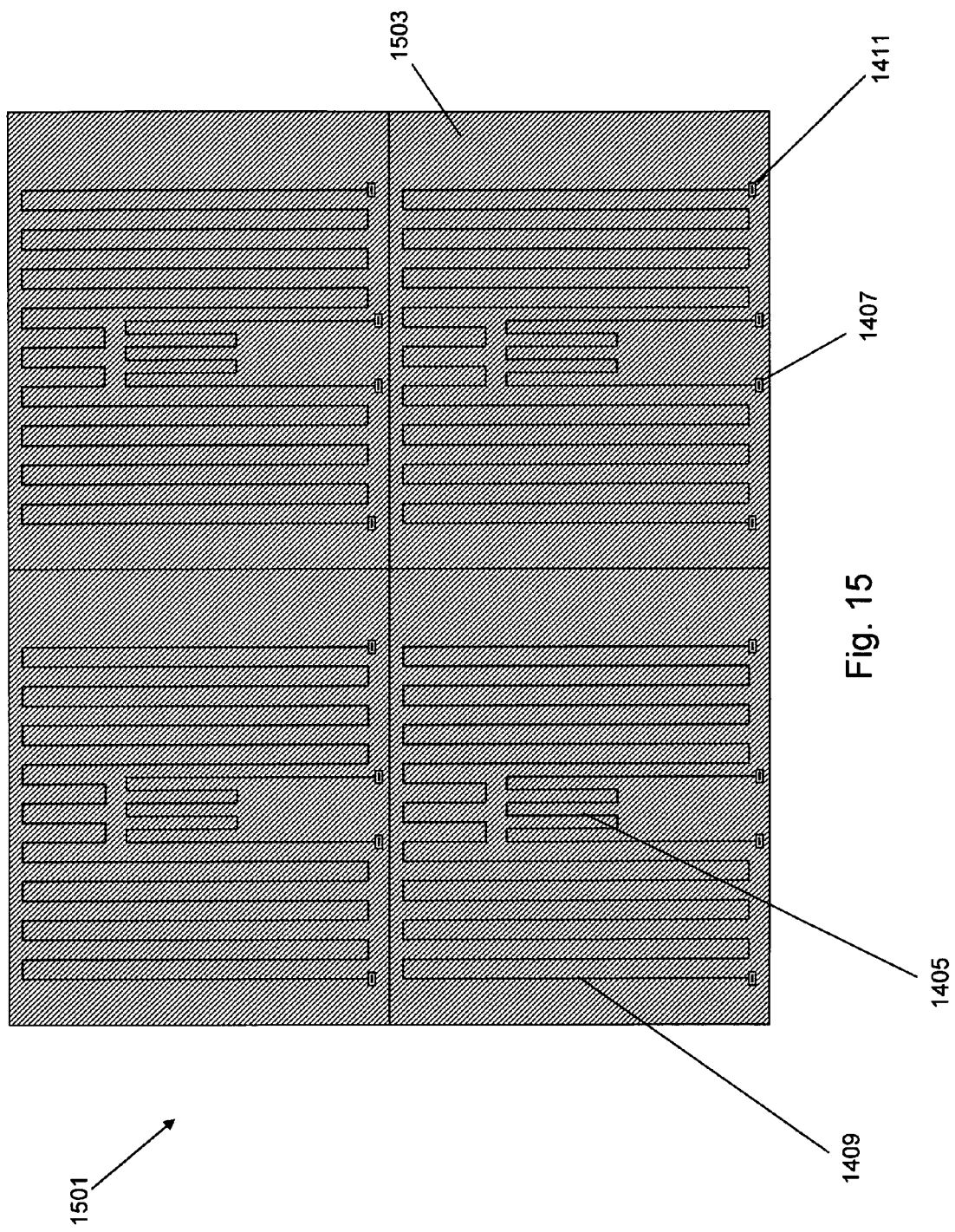

PACKAGED DIE HEATER

GOVERNMENT RIGHTS

The United States Government may have acquired certain rights in this invention pursuant to Contract No. DE-FC26-06NT42947 with the U.S. Dept. of Energy, National Energy Technology Laboratory.

FIELD OF THE INVENTION

The present invention relates generally to heating integrated circuits for the purposes of testing and accelerated aging, and monitoring the temperature of integrated circuits during testing and accelerated aging. More particularly, the invention relates to heating integrated circuits in a package to a predetermined temperature.

BACKGROUND

Integrated circuit die may need to be heated for multiple purposes. The die may be heated in order to determine performance at the operating temperature range specified for that die, to perform accelerated life testing by heating the die beyond the specified temperature range to induce accelerated aging, or to heat the die to a preset temperature in order to eliminate those die that may experience early failure.

Integrated circuits may need to be designed to function at different operating temperature ranges based on their intended use. These circuits may be tested at the maximum temperature of the operating temperature range in order to ensure that each individual die can perform at that temperature. Typically, industrial electronics may require that the integrated circuits operate at 85° C., and other high-temperature applications, such as some military electronics, may require the integrated circuits to operate at a temperature of 125° C. or higher.

The die of integrated circuits may fail over time due to stresses from temperature variations. The die may be heated to a temperature beyond the specified operating range in order to perform accelerated life testing, i.e., to heat the die to various temperatures in order to approximate the die's ability to withstand environmental stresses.

The integrated circuits may also be tested to verify the connections between the die contacts and the package contacts. During the life cycle of the die, the connections between the die and the package may fail. Thus, by performing accelerated life testing on a packaged die, failures in the connections between the die and the package may be detected.

Typically, die are heated in an oven to bring the die to the desired heat testing temperature. The die may be batch-heated in a package, and may all be heated to the same temperature in the oven. The die may be tested to determine performance at elevated temperatures. Heating the die in an oven may require that testing components such as connectors, printed wiring boards, sockets, resistors, capacitors, and driver chips be located inside the oven enclosure, and thus the testing components may undergo significant stress due to prolonged exposure to elevated temperatures.

A multi-chip module ("MCM) may comprise several die in a single package. The MCM may fail if a single die fails. Thus, it may be undesirable to heat-test the die after incorporating multiple die into a single package, as all the die in the MCM may be discarded if a single die fails.

Therefore, an improved method of heat testing integrated circuit die is needed.

SUMMARY

The present invention relates to a heater for an integrated circuit die and a temperature sensor for sensing the temperature of an integrated circuit die. The heater may be contained inside the die package, or, alternatively, it may be external to the package.

The heater incorporated into the integrated circuit package may be a layer of ceramic material having a heating filament screen-printed thereon and incorporated into the body of the integrated circuit package. The heater layer may preferably be located near the die attach area of the package. This may create a more efficient heat path from the heater to the die than that accomplished by using an oven or an external heater.

Also, temperature stresses on the testing components may be reduced, as the testing components may be in a lower temperature environment than when the die are heated by using an oven alone or an external heater.

The heater has at least two leads, and when a voltage is applied across the heating filament the ceramic layer is heated and transmits heat to the die. The leads for the heater may be connected with the leads of the integrated circuit package.

In a package having multiple die, there may be multiple heaters that may be individually controlled. In this way, die in the packages may be individually heated to obtain a desired temperature. This is advantageous, as individual die produce different amounts of heat during testing, which may affect the temperature of the die itself. Also, if a die is found to be faulty during testing, the die may be removed from the package by heating the die area to weaken the die attach material without damaging the surrounding die. After the die attach is heated, the die may be more easily removed from the package than in known methods of removing faulty die such as applying hot air to heat the die attach material and shearing the die from the die attach site or by grinding the die out of the package.

Because the heating element may be located inside the die package, there are not restrictions on the number of die that may be heated at a single time. When using ovens to heat the die, the volume of the oven restricts the number of die that may be heated at one time. For packages having a heater inside, the number of packages that may be burned-in at one time is dependent on the number of contacts available to provide a voltage to the heating element to heat the die.

A further advantage of the invention is that the heating filament, or, alternatively, a separate temperature thermistor, located in the heater ceramic layer may be used as a temperature sensor to measure the temperature of the die. The temperature sensor may have leads in electrical communication with the leads of the package. This temperature sensor may provide a more accurate die temperature reading than that which may be obtained by placing a temperature sensor on the package lid or elsewhere on a surface of the package because of its location close to the die.

Further, the die generates heat during operation; thus, during testing, the die gives off heat that may raise the temperature of the die and its surroundings. A temperature sensor located close to the die may provide accurate temperature readings for the die including the temperature changes caused by heat given off by the die while being tested. Placing a plurality of temperature sensors close to a plurality of die may provide improved temperature feedback by measuring the temperature of each die or of a plurality of dies. Thus, the temperature changes caused by heat given off by the each die during testing may be better approximated, and the testing and burn-in temperature of individual die and packages may be better controlled.

In some types of integrated circuit packages, it may be advantageous to provide a heater external to the integrated circuit package. A reusable external heater may be more economical than a heater layer located in a package, or it may be difficult to add a heater layer into certain integrated circuit packages. For instance, it may be difficult to add a ceramic heater layer into a plastic package. An external heater may be a simple ceramic solid plate, or it may be a ceramic heater having clearance holes for package pins to pass through. A solid ceramic plate heater may be used with peripheral-leaded packages such as flatpacks or quad flatpacks. Alternatively, a heater having clearance holes for package pins to pass through may be used with a pin grid array package or other type of package having contacts on its bottom surface.

The heater may be used alone to heat the die, or it may be used in combination with an oven to attain the desired temperature. In this way, the die may be heated to a temperature above that which the heater or the oven may attain by itself.

These as well as other aspects and advantages will become apparent to those of ordinary skill in the art by reading the following detailed description, with reference where appropriate to the accompanying drawings. Further, it is understood that this summary is merely an example and is not intended to limit the scope of the invention as claimed.

BRIEF DESCRIPTION OF THE DRAWINGS

Presently preferred embodiments are described below in conjunction with the appended drawing figures, wherein like reference numerals refer to like elements in the various figures, and wherein:

FIG. 15 is a top view of a layer of an integrated circuit package having a plurality of temperature sensors and a plurality of heater filaments, according to an example.

DETAILED DESCRIPTION

An improved apparatus for heating integrated circuit die is described. This method and apparatus include providing a local heater to heat packaged die to an elevated temperature. The heater may be incorporated into the package, or may be external to the package.

Figure 1:
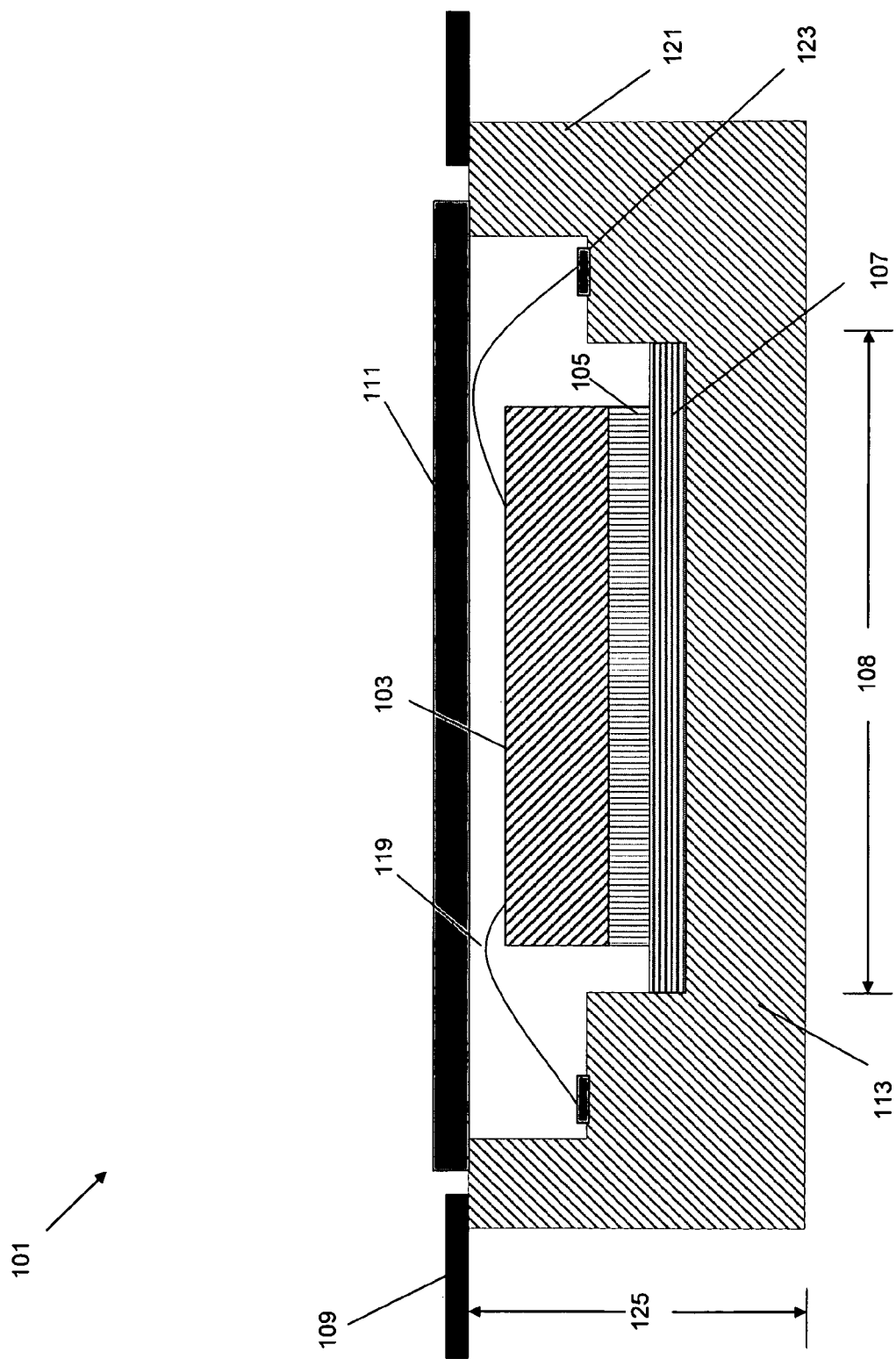
FIG. 1 is a cutaway view of an integrated circuit in a package, according to a first embodiment.

The heater may be incorporated into many types of die packages. FIG. 1 is a cutaway view of an integrated circuit package ("IC package") 101. The integrated circuit package may be a flatpack or a quad flatpack package. The IC package may comprise a plurality of layers. Each layer may be formed from a ceramic, such as alumina, aluminum nitride, or another ceramic known in the art. A ceramic layer may be formed by adding a binder to a ceramic powder to form a flexible tape. The tape may be cut to have the desired geometry for the package to be produced. Holes may be punched into the tape, and the holes may be filled with a conductive metal to form vias. Connecting lines, which may be formed from a conductive metal, may be screen-printed onto the tape in order to produce the desired connections within the package when the layers are stacked. The layers may then be stacked, laminated, and fired at a high temperature. The package may then be finished by electroplating the package.

After the package is finished, the package may receive an integrated circuit ("die"). The bonding pads on the die may be placed in electrical communication with bonding pads on the package by wire bonding or flip-chip bonding the bonding pads of the die to the bonding pads of the package. A lid may be placed over the package to form a hermetic seal. Methods and materials used to form IC packages as described above are well known in the art and not illustrated here.

The layers of the IC package may form the IC package base 113. Some additional layers may have an open area in their center and may be stacked onto the IC package base 113 to form package sides 121. The package base 113 and package sides 121 may be comprised of a plurality of layers having electrical connections therein. Package bonding pads 123 may be located on the package base 113 or the package sides 121. The package bonding pads are shown in FIG. 1 having package bonding pads 123 on the package sides 121, but the package bonding pads 123 may be located in any location on the IC package 101 that may form an electrical connection to the package leads 109. The package base 113 and package side walls form the package body 125.

Figure 2:
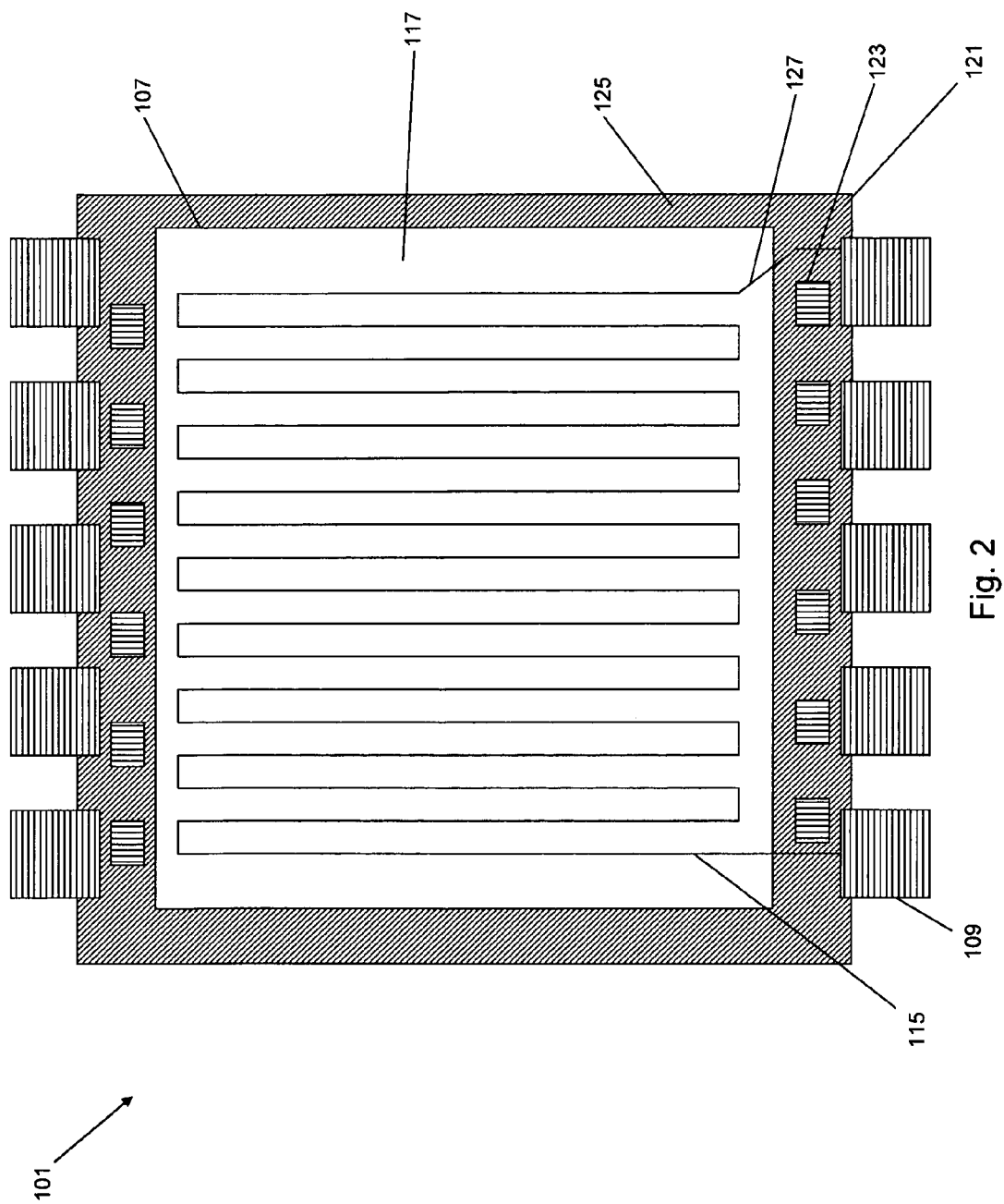
FIG. 2 is a top view of a heater layer of the package, according to an embodiment.

One of the layers of the IC package 101 may be a heater layer 107, discussed further with respect to FIG. 2. The heater layer 107 may have a heater filament, discussed further with respect to FIG. 2, screen-printed thereon. The heater layer 107 is shown extending between two package sides 121; however, the heater layer 107 may be any size. The heater layer 107 is shown in FIG. 1 as the top layer of the package base 113; however, the heater layer 107 may be located anywhere in the package base 113. However, locating the heater layer 107 as close as possible to the die 103 may provide advantageous heat transfer to the die 103.

The area in the package body 125 formed by the package sides 121 and the package base 113 is the die cavity 108. On the top surface of the of the die cavity 108 is deposited die attach 105. Die attach 105 may be any type of die attach material known in the art, for example, alloys of tin, lead, or silver, gold-silicon, metallic glasses, or an organic adhesive such as an epoxy.

The die 103 is placed on top of the die attach 105. The die attach secures the die 103 to the heater layer 107. Die attach 105 is shown as covering less than the entire surface of the die cavity 108. However, die attach 105 may be any shape and size suitable to attach the die 103 to the die cavity 108.

After the die 103 has been attached to the top of the die cavity 108 by the die attach 105, connections 119 are formed between the die bonding pads, not shown in FIG. 1, and the package bonding pads 123. The package leads 109 are composed of a conductive material. The package bonding pads 123 are electrically connected to the package leads 109 through metal layers in the IC package 101. The IC package 101 has multiple bonding pads 123, and the die has multiple die bonding pads. The process of bonding the die bonding pads to the package bonding pads 123 is well known in the art and may be accomplished, for example, by aluminum wire bonding, gold wire bonding, or tape automated bonding. Alternatively, the die 103 may be flip-chip bonded to package bonding pads 123 located on the package base 113, as discussed with respect to FIGS. 6, 8-9. Methods of bonding die 103 to packages are well-known in the art and not discussed here.

The package lid 111 seals the IC package 101. The seal may be a hermetic seal. The package lid 111 may be metal or ceramic. The package lid 111 may be welded, soldered, or glass-sealed to IC package 101, or may be attached according to any other method known in the art.

FIG. 2 shows the heater layer 107 of IC package 101. The heater layer 107 may be composed of heater ceramic 117 and heater filament 115. Heater ceramic 117 may be any type of ceramic material, and may be the same material as the package body 125, such as, for example, aluminum oxide. A known ceramic having a high thermal conductivity is aluminum nitride. The heater filament 115 may be any type of resistive metal heating element. Tungsten, platinum, and molybdenum are known types of resistive heating elements with beneficial properties. The heater filament 115 may be screen-printed in a serpentine pattern. The width, depth, and length of the heater filament 115 may be varied, as well as the distance between the strands, depending on the heat output requirements of the heater layer 107.

The heater filament 115 has two heater filament ends 127 that may connect to package leads 109 through vias located in the layers of the IC package 101. A voltage may be applied across the heater filament 115 through the package leads 109 connected to the heater filament ends 127 to produce heat to heat the die 103. The heater filament 115 may be any size and shape and may be connected to any of the package leads 109.

Additional package leads 109 may be connected to each end of the heater filament 115, and may be used to estimate the temperature of the heater ceramic 117. The temperature of the heater ceramic 117 may be estimated by measuring the resistance of the heater filament 115 when a voltage is not being applied across the heater filament 115 to heat the heater ceramic 117. This configuration is known in the art as a Kelvin probe. Methods of estimating temperature by measuring the resistance of a filament are well known in the art, and are not shown in FIG. 2.

Figure 3:
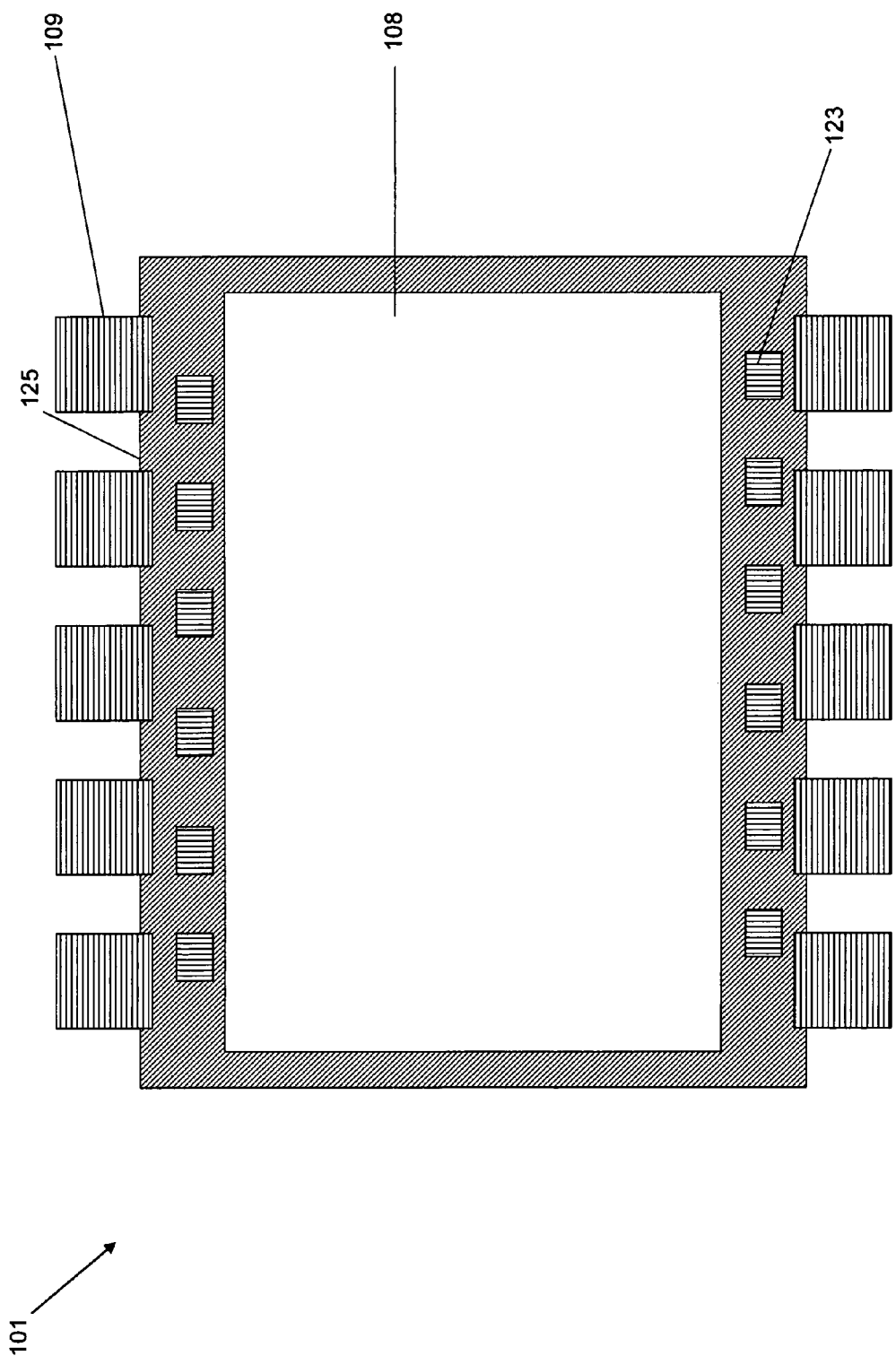
FIG. 3 is a top view of a die cavity of the package, according to an embodiment.

FIG. 3 is a top view of the layer of the IC package comprising the die cavity 108, including the package body 125, package bonding pads 123, and package leads 109 of IC package 101. The die cavity 108 comprises a ceramic layer located over the heater ceramic 117 to electrically isolate the heater filament 115 from areas of the die 103 located on the die cavity 108.

Figure 4:
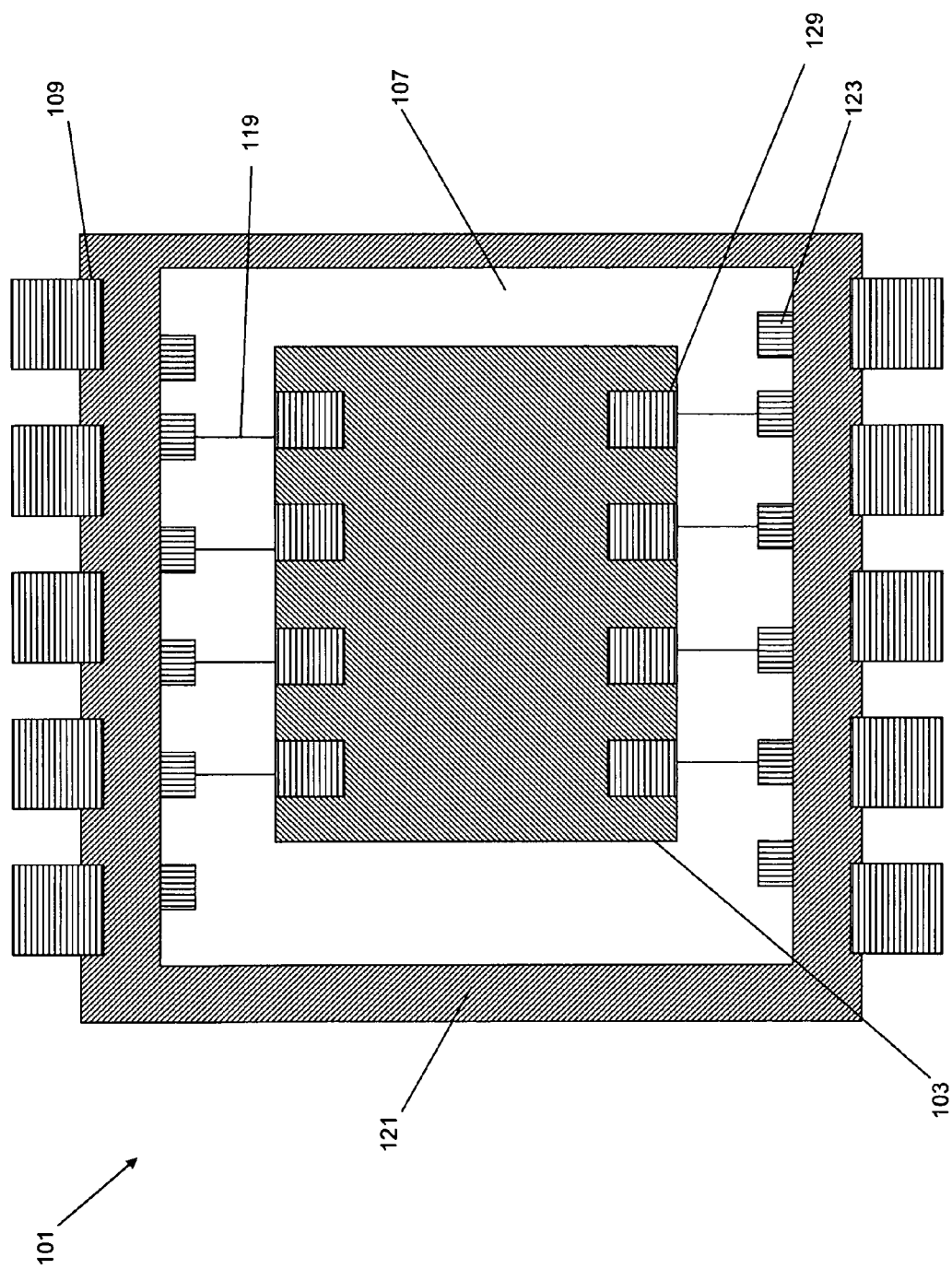
FIG. 4 is a top view of the integrated circuit in the package of FIG. 1, according to another embodiment.

FIG. 4 shows the die 103 having connections 119 between the die bonding pads 129 and the package bonding pads 123.

The die 103 is shown on top of the heater layer 107, secured by die attach 105, not shown in FIG. 4, but discussed with respect to FIG. 1. Package bonding pads 123 may connected to the package leads 109 with in the layers of the IC package 101.

Figure 5:
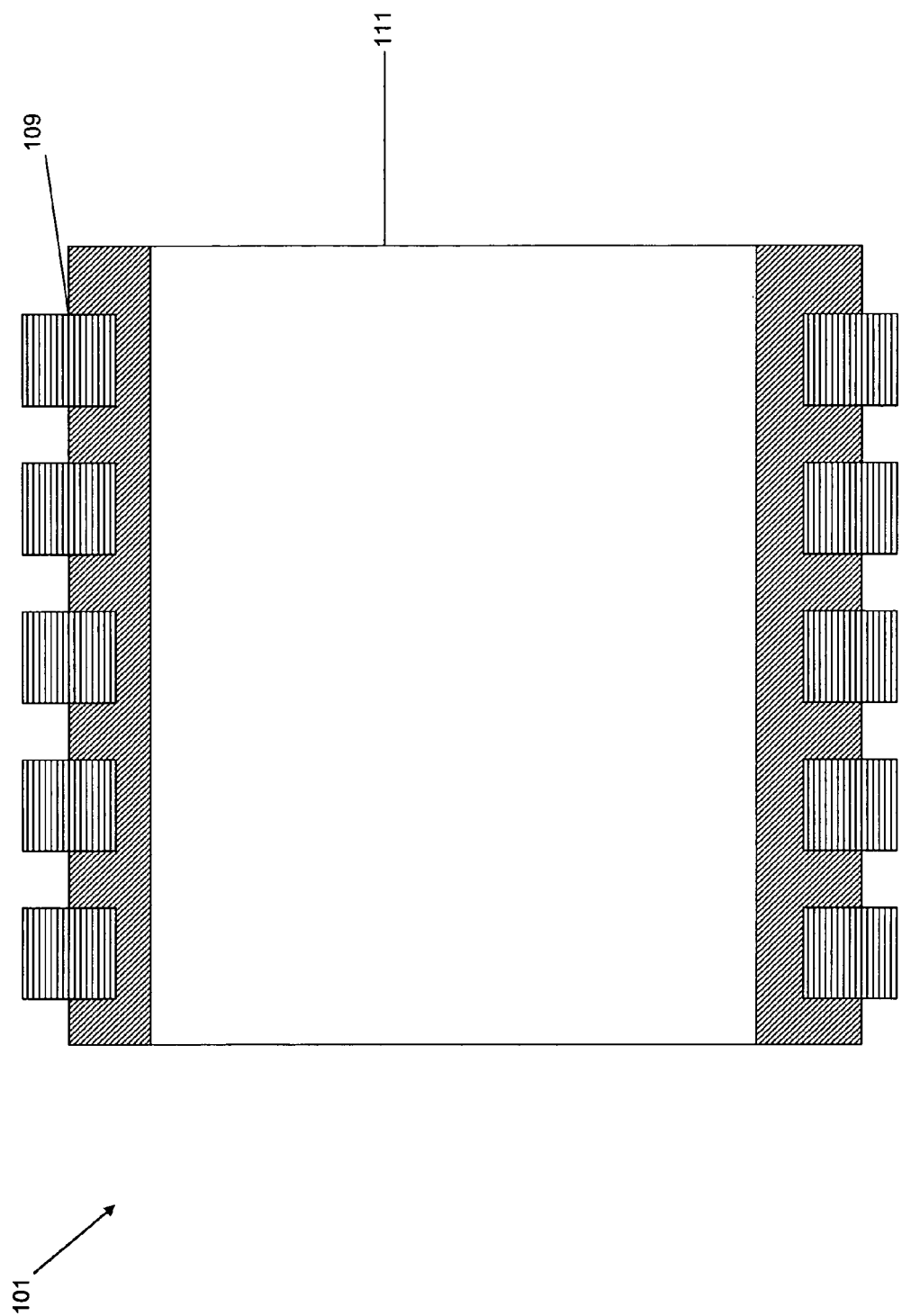
FIG. 5 is a top view of the package of FIG. 1, having the lid installed over the integrated circuit, according to an embodiment.

FIG. 5 shows the IC package 101 with the package lid 111 attached. The package lid 111 is sealed onto the IC package as described with respect to FIG. 1. When the die 103 is tested, the package leads 109 are connected to testing components through printed wiring boards. Voltage is applied across the package leads 109 connected to the heater filament 115 in order to heat the package, and thereby heat the die 103.

The die 103 may be tested to determine its performance at various temperatures. The packaged die may also be heated to test the packaged die's long-term performance under heat stresses.

Providing a heater layer 107 inside the IC package 101 to heat the die 103 may provide advantages over the use of an oven alone to heat the die 103. First, because the heater layer 107 locally heats the die 103, it may use less energy than using an oven alone. Heating die in an oven uses convective heat on the lid of the package to heat the die in that package. The oven must first heat the space around the package, the package lid, the space around the die, and finally the die itself. Providing a heater layer 107 below the die attach 105 on the IC package 101 provides a more direct heat path. Additionally, this configuration utilizes conductive heat transfer, which may be more efficient than convective heat transfer. Therefore, providing a heater layer 107 inside the IC package 101 may provide a more efficient way of heating the die 103.

Using the heater layer 107 inside the IC package 101 to heat the die 103 may also reduce the temperature stress on the components surrounding the die 103. Thus, the die 103 may be heated to a preset temperature by the heater layer 107, while surrounding components may be at a lower temperature. Components such as the circuit boards and some parts of the packaging may have lower operating temperature requirements than those for the die 103. In this way, unnecessary stresses on surrounding components caused by high temperature exposure may be reduced.

Using the heater layer 107 inside the IC package 101 to heat the die 103 reduces fatigue on the testing components caused by high temperature exposure. A package having integrated heat-testing capability may be used to heat the die alone, or in conjunction with heat applied in an oven. Temperatures inside the oven during heating may be very high, sometimes even higher than the burn-in temperature of the die 103. When die are burned in using the package having integrated heat-testing capability in conjunction with an oven, the oven temperature may be lower than when an oven alone is used to heat the die.

Typically the testing components must operate inside the oven to be able to make contact with the package leads 109. Testing components used inside an oven may undergo repeated exposures to high temperature and may experience stress and fatigue due to these repeated exposures. Using the heater layer 107 inside the IC package 101, the testing components may operate in a much lower-temperature environment by contacting the package leads 109 of a locally-heated die 103. Thus, fatigue and stresses on the testing components due to exposure to high temperatures is greatly reduced. Testing components may be very expensive or difficult to replace, and may be used repeatedly for die testing. Therefore, reducing temperature stresses on the testing components provides a significant advantage.

A further advantage is that the heater filament 115 may be used to sense the temperature of the heater ceramic 117 by monitoring the changes in the resistivity of the heating element. Alternatively, a separate resistive temperature sensor or sensors may be screen-printed on the heater layer 107 to act as a temperature sensor, as described with respect to FIGS. 14 and 15.

Because the heater ceramic 117 is located close to the die 103 and heats the die 103 by conduction, the temperature of the heater ceramic 117 may be very close to that of the die 103. In oven heat testing, the temperature of the die 103 may be approximated by sensing the temperature of the package lid 111, or at another location on the IC package 119. However, because the temperature of the heater ceramic 117 is much closer to the temperature of the die 103, the heater filament 115 or a separate temperature sensor may provide more accurate temperature data. This is useful both in controlling the temperature to which the die 103 is heated during testing, and for obtaining more accurate data on die performance at various temperatures.

Figure 6:
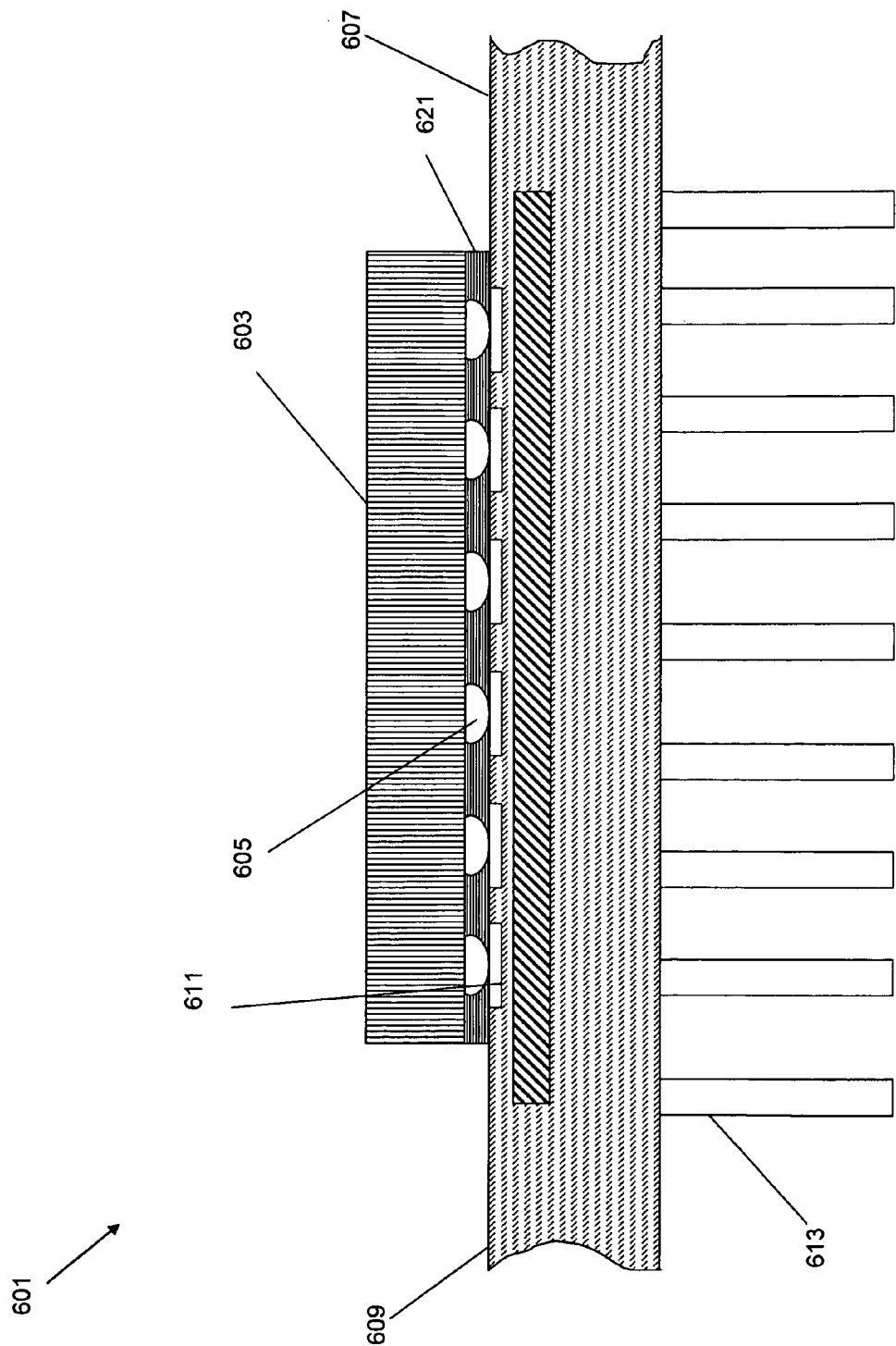
FIG. 6 is a cutaway view of an integrated circuit in a package and an integrated circuit die, according to an embodiment.

FIG. 6 shows another example of an IC package 601. The IC package 601 has a package base 609 with a heater layer 607 therein. The contact pads 611 and leads 613 are located on the bottom surface of the package base 609. The leads 613 may be connected to contact pads 611 through vias located within the package bottom layer 609. The vias are not shown in FIG. 6, but methods of connecting leads 613 and contact pads 611 are well known in the art. The connections may be inside the bottom layer 609 above, below, or through the heater layer 607. The area between the leads 613 forms die attach area 623.

The heater layer 607 is shown in FIG. 6 inside the package bottom layer 609. The heater layer 607 may be located anywhere in the package bottom layer 609. However, locating the heater layer 607 as close as possible to the die 603 may provide advantageous heat transfer to the die 603.

The leads 613 may be any shape, and may also be rounded contacts, known in the art as a ball grid array. The contacts 605 on the die 603 are soldered to the contact pads 611 using a conductive solder. Methods of soldering the die 603 to contact pads 611, such as flip-chip bonding, are well known in the art. Alternatively, the die may be wire bonded to form electrical contact between the package leads and the die bonding pads, depending on the configuration of the die 103. The area between contacts 605 on the die 603 and the die attach area 623 may be filled with an underfill 621. The underfill 621 may be an organic polymer such as epoxy or cyanate ester. The underfill 621 may be dispensed in liquid form and may flow by capillary action underneath the die 604 to fill the area between the bottom area of the die 603 and the die attach area 623.

Figure 7:
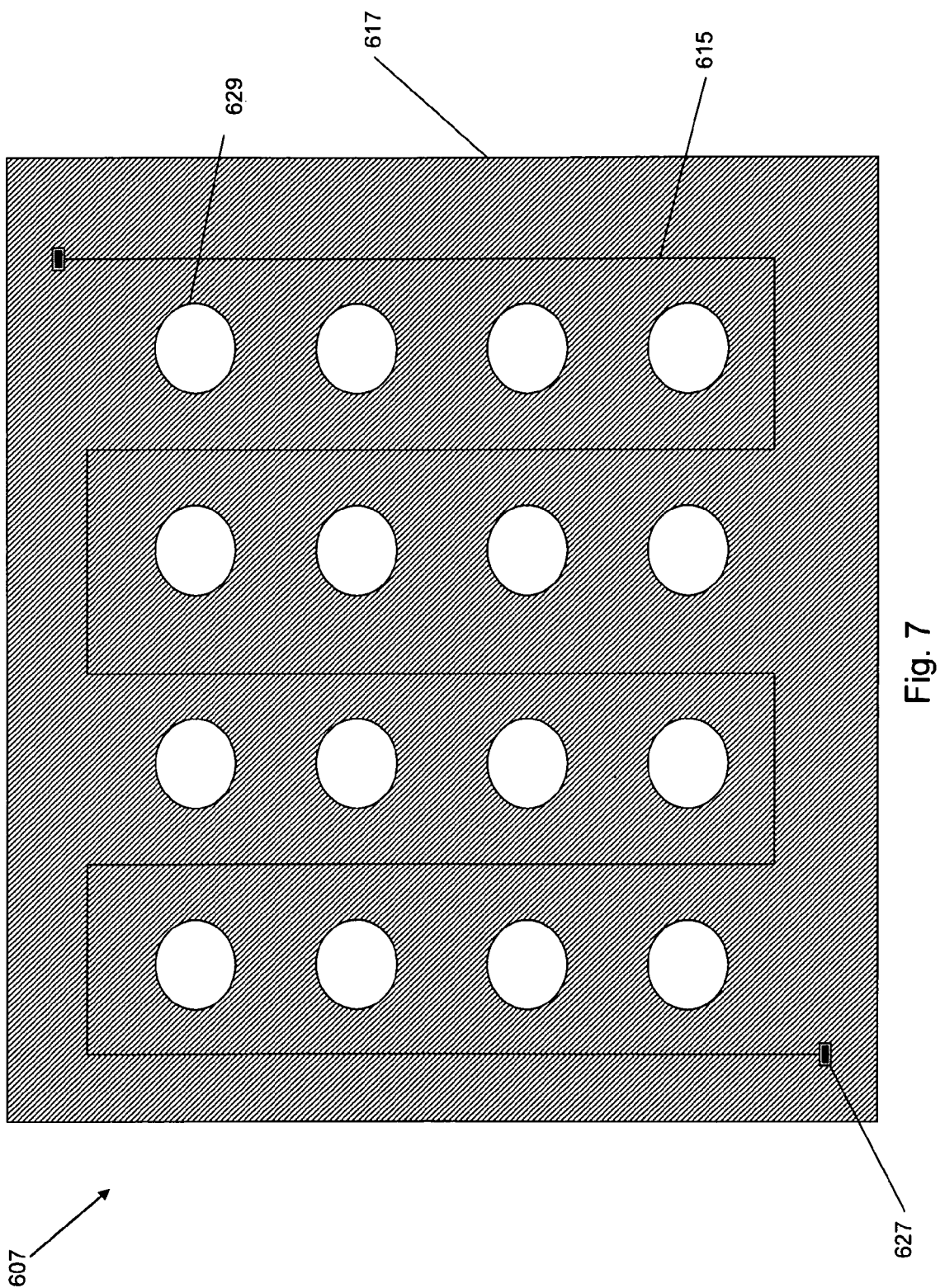
FIG. 7 is a top view of the heater layer of the package of FIG. 6, according to an embodiment.

FIG. 7 shows heater layer 607, having heater filament 615 and heater ceramic 617. The heater filament 615 has two heater filament ends 627 which may be connected to package leads though vias in the package body. Voltage may be applied across the package leads attached to the heater filament ends 629 to heat the heater ceramic 617.

The heater layer 607 may have vias 629 that run through the heater layer 607 to form connections between the contact pads 911 and the leads 913. As described with respect to FIG. 10, the vias 629 may be located in the bottom layer 609 and may be located outside the heater layer 607. If all vias 629 are located outside the heater layer 607, then the heater layer 607, and heater filament 615 may be formed as described with respect to FIG. 10. The heater filament contacts 627 may be connected to the package leads through connections located inside the package body.

If vias 629 are located in the heater layer, the heater filament 615 may be formed in the heater ceramic 617 so as not to come into unintended electrical contact with the vias 629. The heater filament 615 may be formed as shown in FIG. 7. The heater filament may also be an alternative serpentine pattern having, for example, multiple rows of heater filament 615 between the contacts 619. The vias 629 may have a different pattern than shown in FIG. 7. The heater filament 615 may be any pattern, size, or shape, provided that the heater filament 615 does not come into unintended electrical contact with the leads 619.

Figure 8:
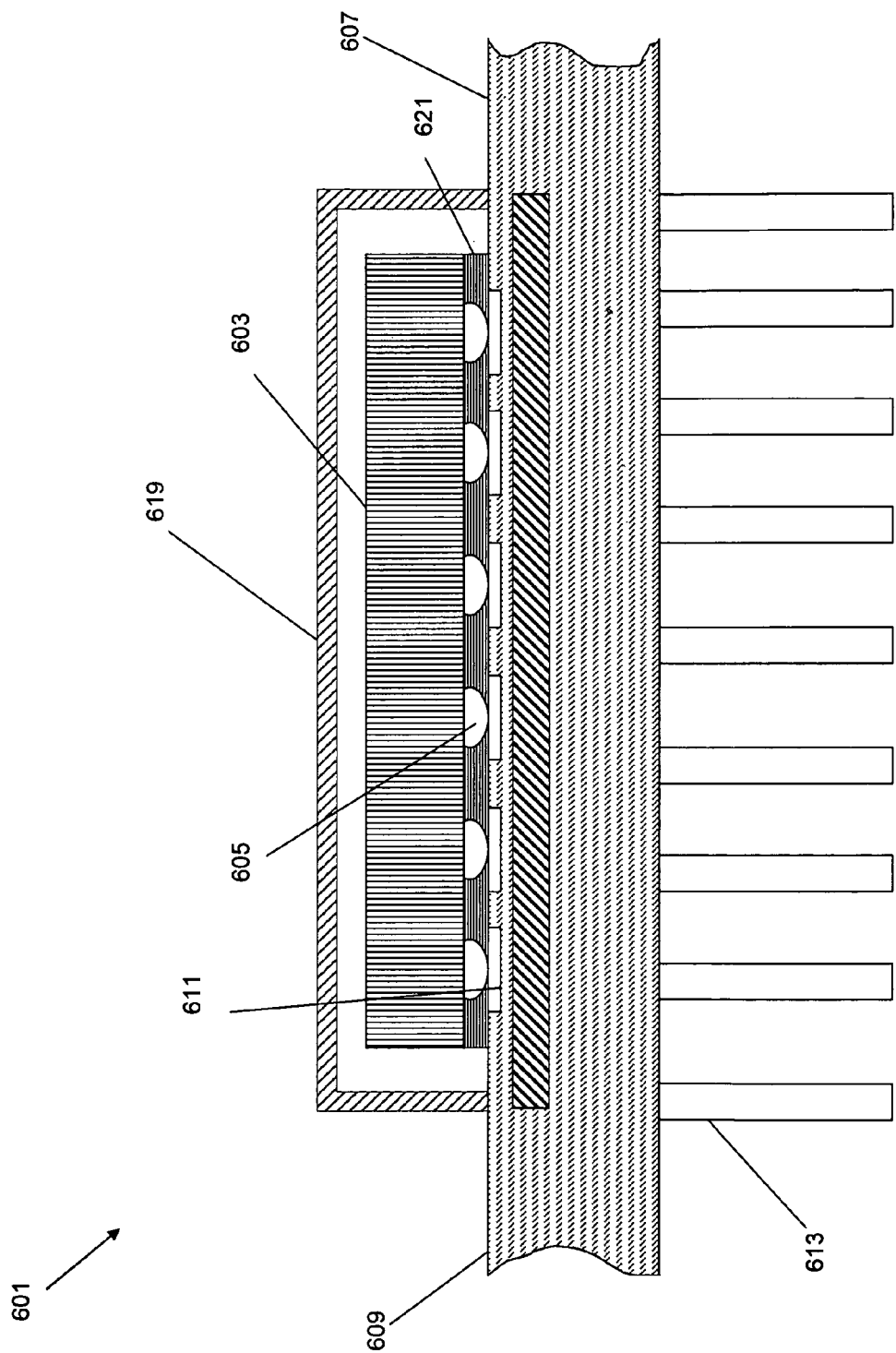
FIG. 8 is a cutaway view of the package and an integrated circuit die of FIG. 6, having the package lid installed over the integrated circuit die, according to an embodiment.

FIG. 8 shows the IC package 601 with a package lid 619 located over the die 603. The package lid may be sealed over the die 603 as described with respect to FIG. 1.

Figure 9:
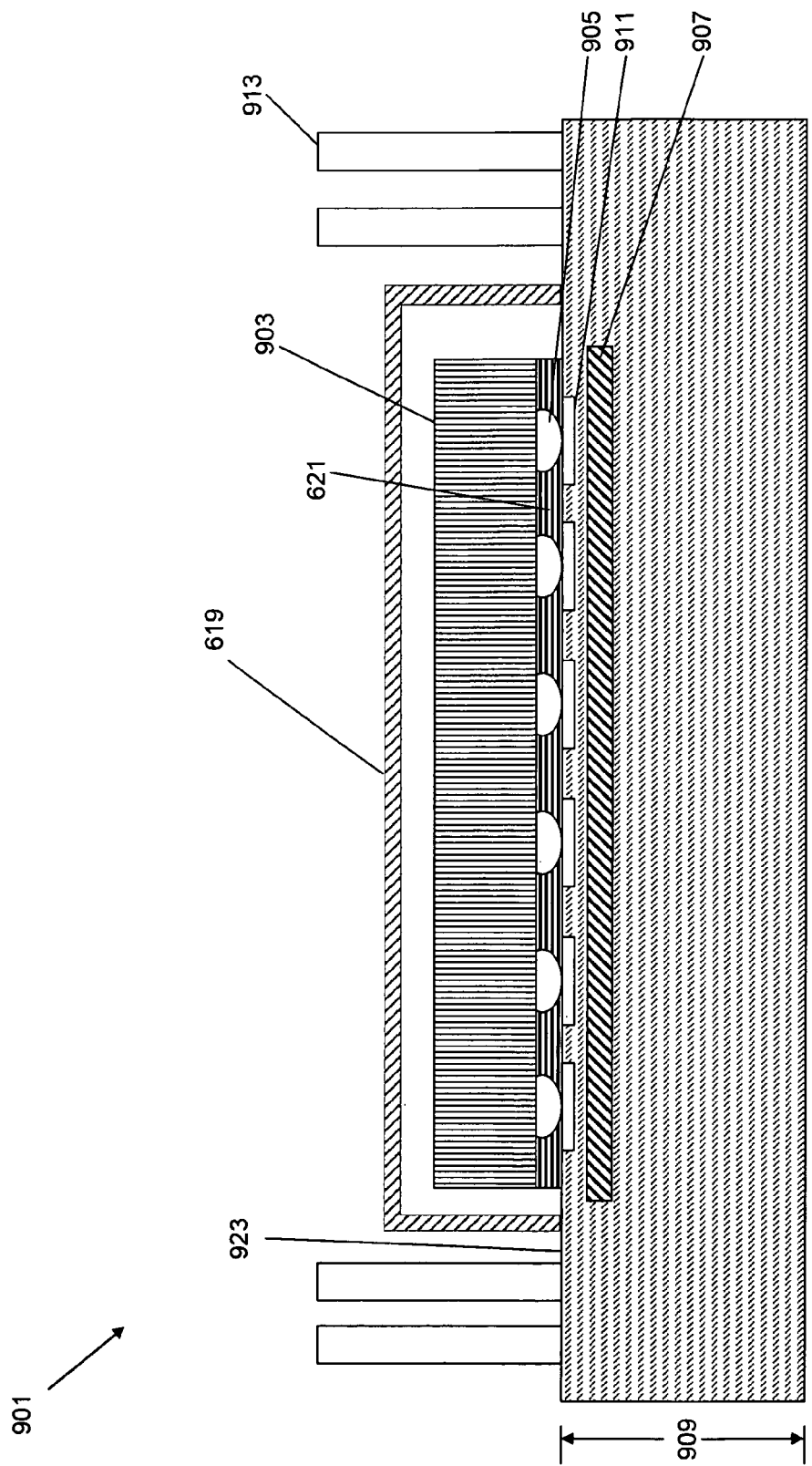
FIG. 9 is a cutaway view of a package and an integrated circuit die, according to an embodiment.

FIG. 9 shows another example of an IC package 901. The IC package 901 has a package bottom layer 909 with a heater layer 907 therein. Contact pads 911 are located on the die attach area 923 of the bottom layer 909. Leads 913 are located on the top surface of bottom layer 909. The leads 913 are connected to contact pads 911 through vias located within the package bottom layer 909. The leads 913 may be any shape, and may also be rounded contacts, known in the art as a ball grid array. The leads 913 may be a single row, or may be a column grid array having multiple rows of leads 913.

The heater layer 907 is shown in FIG. 1 as the top layer of the IC package 901; however, the heater layer 907 may be located anywhere in the IC package 901. However, locating the heater layer 907 as close as possible to the die 103 may provide advantageous heat transfer to the die 903.

The connections may be inside the bottom layer 909. The connections may be inside the bottom layer 909 above, below, or through the heater layer 907. The contacts on the die 903 are soldered to the package contact pads 911 using a conductive solder, and may be connected as described with respect to FIG. 9. The connections are not shown in FIG. 9, but methods of connecting leads 913 and contact pads 911 are well known in the art.

Figure 10:
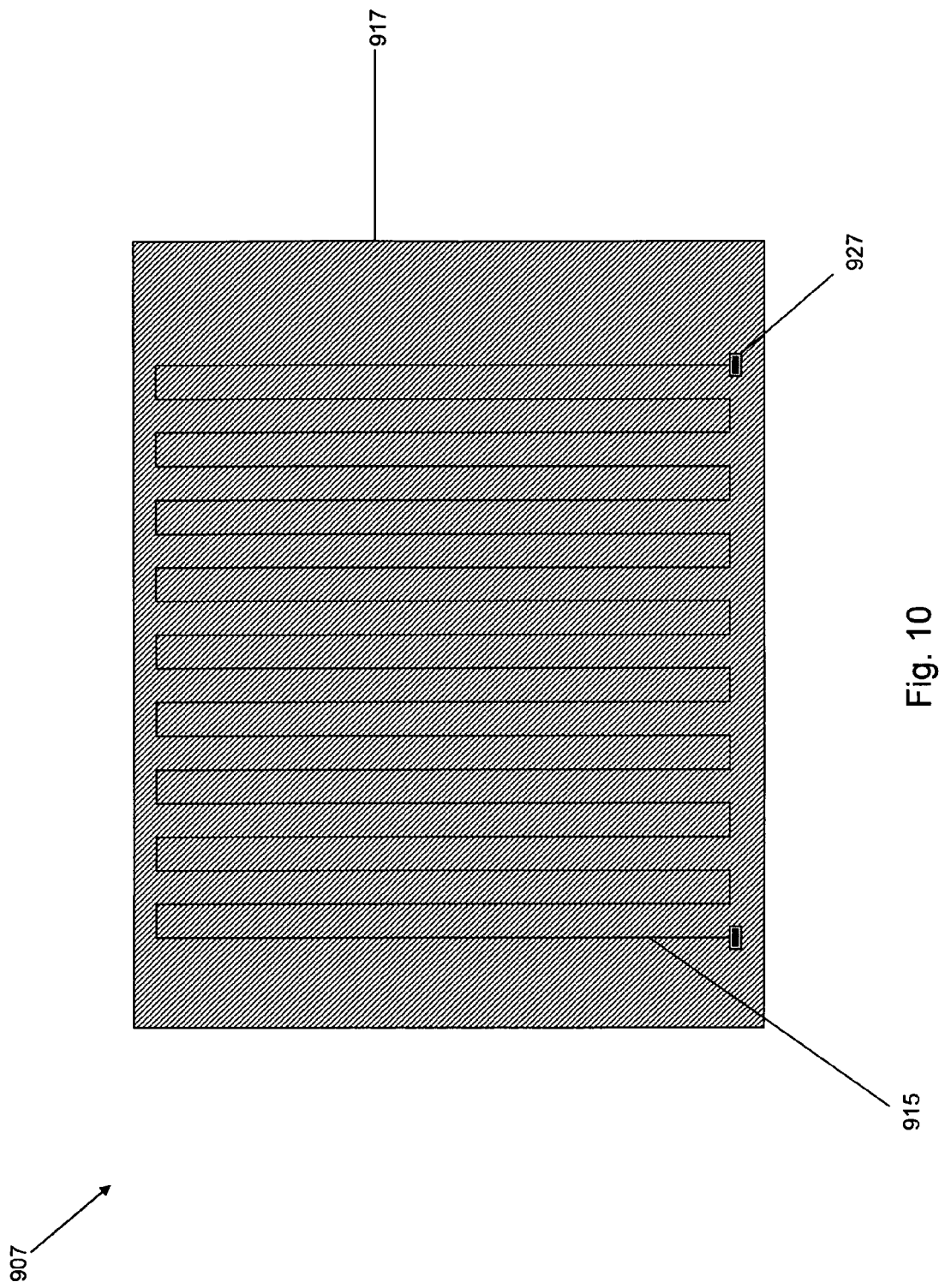
FIG. 10 is a top view of the heater layer of the package and integrated circuit die of FIG. 9, according to an example.

FIG. 10 shows heater layer 907, having heater filament 915 and heater ceramic 917. The heater layer 907 is located inside the bottom layer 909. The heater filament 915 has two heater filament ends 927 across which voltage may be applied to heat the heater ceramic 917. The heater filament ends 927 are electrically connected to leads 913 through vias located within the bottom layer 909. These connections are not shown in FIG. 10; however, methods of connecting leads to a contact within the bottom layer 909 are well known to persons of skill in the art. The heater ceramic 917 and heater filament 913 may be formed as described with respect to FIG. 2. The heater filament 915 may be any size and shape and may be connected to any of the leads 913.

The advantages described with respect to IC package 101 are also advantages of the IC packages 601 and 901. Further, a plurality of die 103, 603, 903 may be attached to the receiving surface of a package 101, 601, 901, and one or more die 103, 603, 903 may be heated by the heater layer 107, 607, 907. The heater layer may be incorporated into a variety of integrated circuit package types and shapes, and the scope of the claims should not be limited to the packages of FIGS. 1-9, but rather in accordance with the claim language itself.

Figure 11:
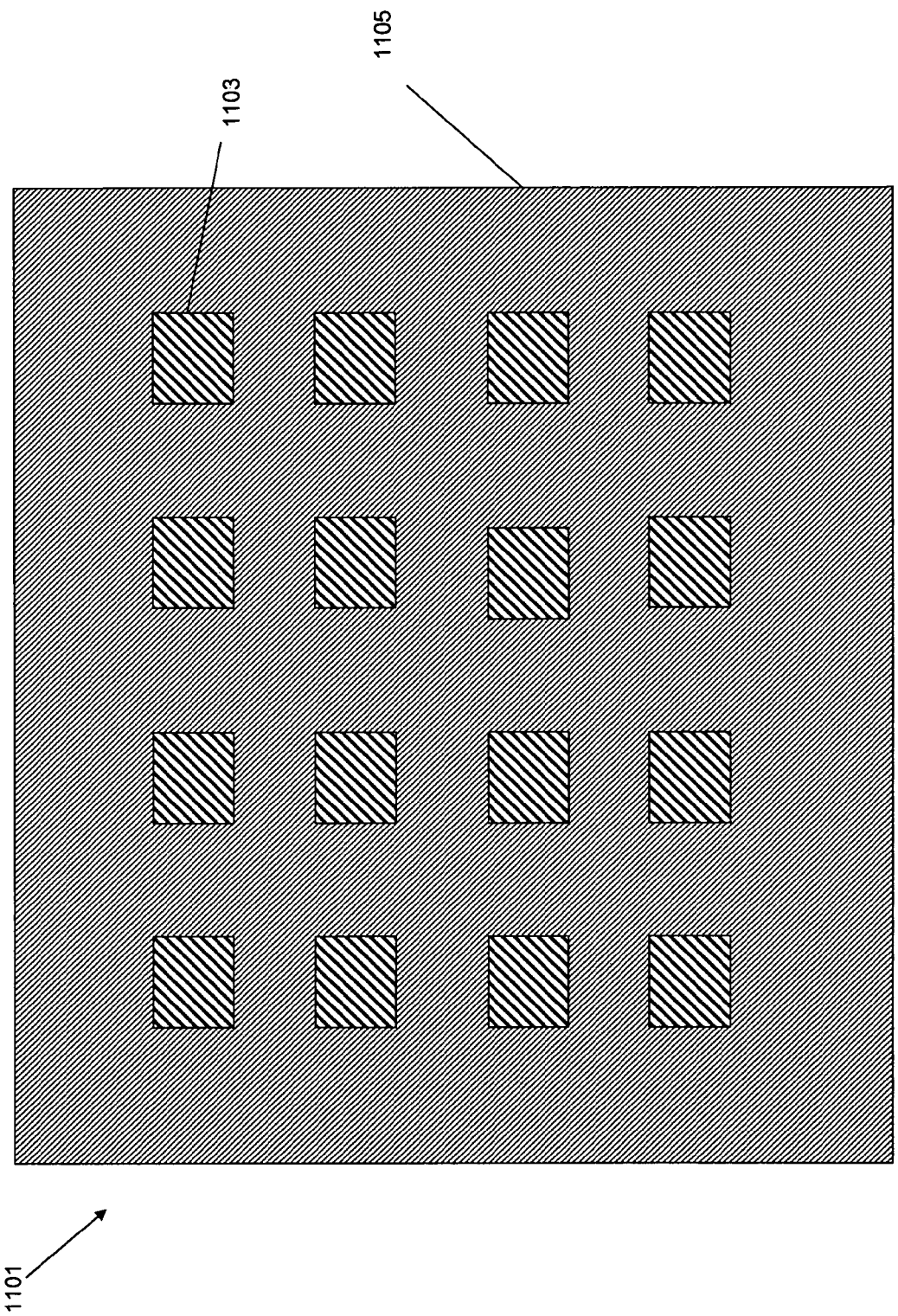
FIG. 11 is a top view of the heater layer of a package having multiple die attached thereto, according to an example.

In another embodiment, multiple heaters may be located inside a single package. FIG. 11 shows a die attach area 1101 of a package having a heater layer 1101 thereon. A plurality of die 1103 may be located on the heater layer 1105. The die 1103 may be attached to the heater layer 1105 according to the methods described with respect to FIGS. 1-10, or by any other method known in the art.

The heater layer 1101 may have heater ceramic 1105 and a plurality of heater filaments thereon, located under each die 1103. The heater filaments may be formed as described with respect to FIG. 2. Each heater filament has two leads through which a voltage may be applied to heat the die 1103. The heater filament leads may be connected to the package leads through connections located inside the package body, as described with respect to FIG. 10. In this way, each die 1103 may be individually controlled by controlling the voltages applied to the heater filaments separately. Additionally, changes in resistivity of the heater filament may be used to measure the temperature of the heater layer close to a single die 1103, as described with respect to FIG. 2. Alternatively, the temperature of the die may be determined by a different temperature sensor or sensors located in the heater layer 1101, as described with respect to FIG. 15.

By heating the die 1103 with a heater layer 1105 having multiple heating filaments which may be individually controlled, different die may be heated to obtain a uniform temperature. By estimating the temperature of the die 1103 from the temperature from the resistance of the heater filament or from a separate temperature sensor, the temperature of each die 1103 may be monitored and the voltage applied to the heating filament associated with each die may be varied to obtain the desired temperature.

Being able to heat die to different temperatures may have several advantages. Different die may have different specified temperature operating ranges. By heating individual die to different temperatures, die having low operating temperature ranges or low burn-in temperatures do not need to be heated to the same temperature as surrounding die having higher operating or burn-in temperatures. Thus, unnecessary stress on die having low operating temperature ranges or low burn-in temperatures is reduced, and the energy required for the heat testing is also reduced. Additionally, it may be advantageous to simultaneously test individual components at different temperatures. This method may provide improved data for die performance as a function of temperature.

Also, by heating die to different temperatures, faulty die may be easily removed from packages. If a die is determined to be faulty after heat-testing or burn-in, the die may be removed by using the heater to locally heat the faulty die in order to weaken the die attach material, allowing the die to be more easily removed than by scribing and sawing methods. The faulty die may then be replaced.

Figure 12:
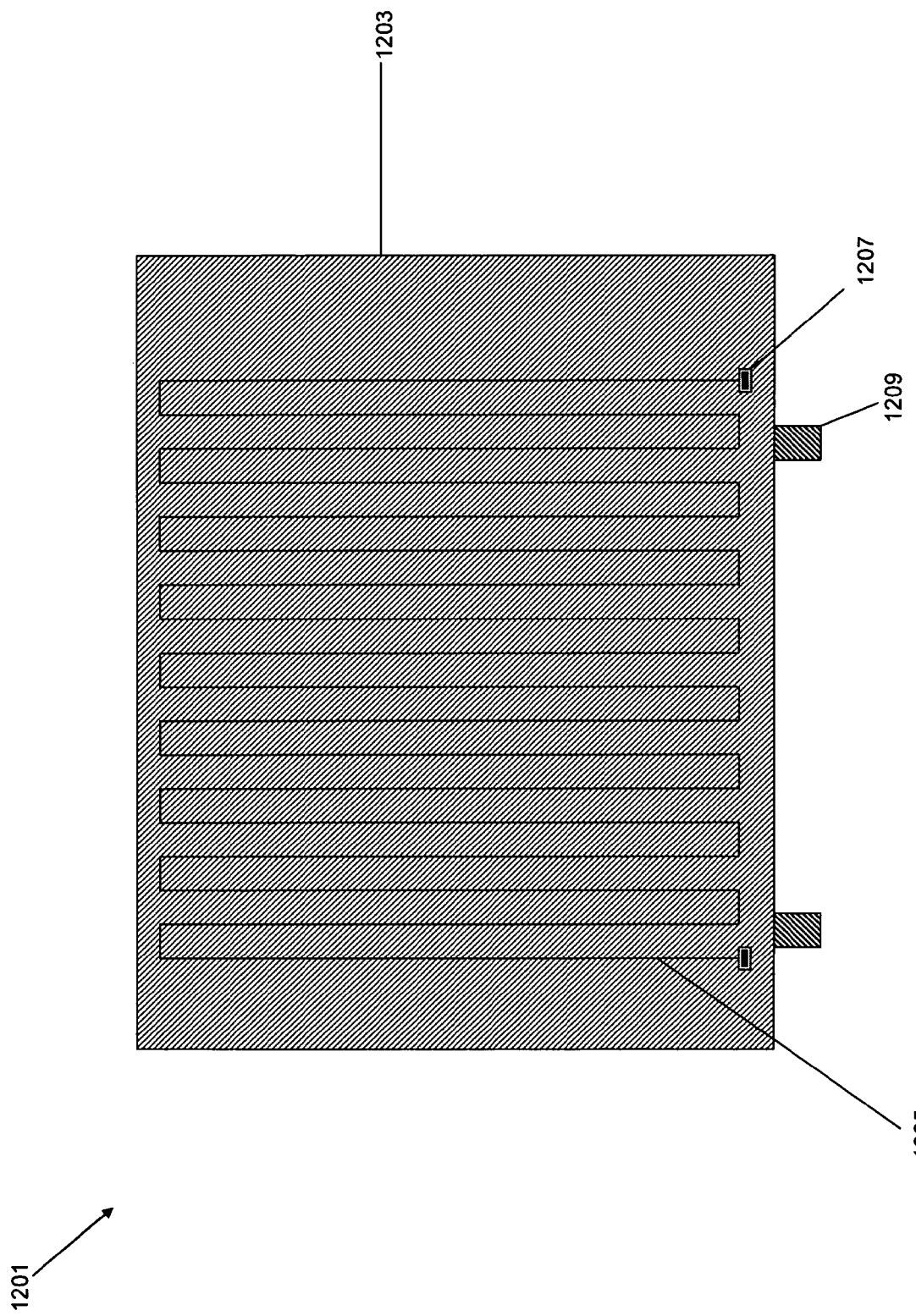
FIG. 12 is a top view of an external ceramic die heater, according to an example.

In another embodiment, the heater may be external to the package. The external heater may be preferred for plastic packages in which it may not be possible to deposit a ceramic layer having a heating filament. FIG. 12 shows an external heater 1201, heater ceramic 1203, heater filament 1205, heater filament ends 1207, and heater filament leads 1209. The external heater 1201, heater ceramic 1203, and heater filament 1205 may be formed as described with respect to FIG. 3. The heater filament leads 1209 may be located on any surface of the external heater 1201, and may be electrically connected to heater filament ends 1207 through vias located in the heater ceramic 1203. A voltage may be applied across the heater filament leads 1209 to heat IC packages located on the external heater 1201. The heater filament 1205 may be used to measure the temperature of the external heater to approximate the temperature of the die close to the heater filament 1205, as described with respect to FIG. 2. Alternatively, a separate temperature sensor or sensors may be placed on the heater ceramic 1203 to estimate the temperature of the heater ceramic 1203 as described with respect to FIGS. 14 and 15.

The external heater 1201 may have multiple heater filaments 1205, each having two heater filament leads 1207. The heater filaments 1205 may be individually controlled to heat the packages located on the external heater to different temperatures, as described with respect to FIG. 11.

Figure 13:
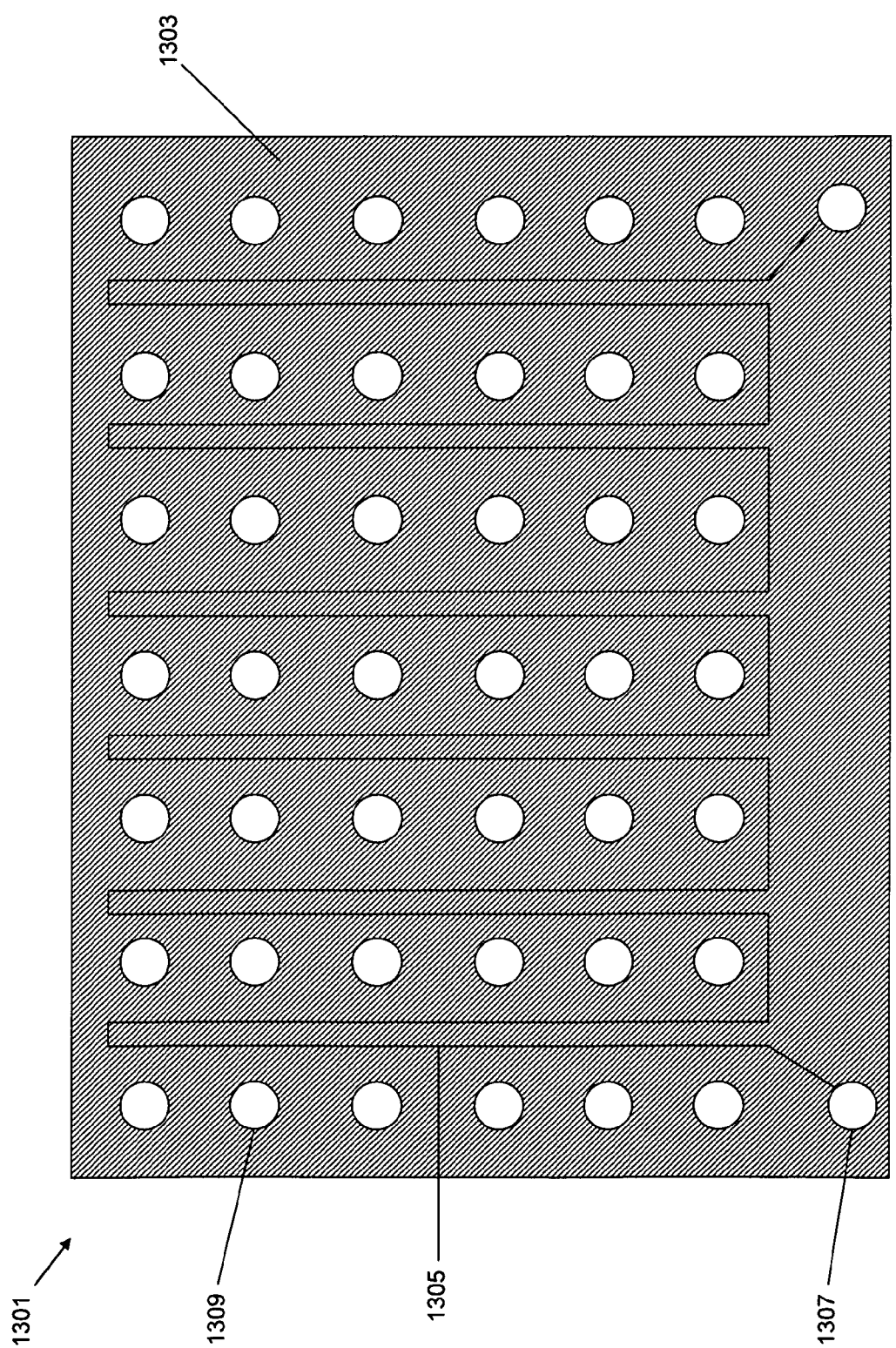
FIG. 13 is a top view of an external ceramic die heater having clearance holes therethrough, according to an example.

For packages having contacts on the bottom surface of the package, it may be preferred to use an external heater having clearance holes located on the external heater so that the package contacts may be contacted through the external heater. FIG. 13 shows an external heater 1301, heater ceramic 1303, heater filament 1305, clearance holes 1309, and heater filament contacts 1307. The external heater 1301, heater ceramic 1303, and heater filament 1305 may be formed as described with respect to FIG. 3. The clearance holes 1309 are positioned on the external heater 1301 so that package contacts may be contacted through the external heater 1301.

The clearance holes 1309 may allow package leads to pass through the clearance holes 1309, and the clearance holes 1309 may be positioned based on the package lead locations of standard package types. The external heater 1301 may be positioned between the testing components and the package, so that the testing components may make electrical connection with the package contacts of the package being heated through the clearance holes 1309 of the external heater 1301. The heater filaments 1305 may be used to measure the temperature of the external heater to approximate the temperature of the die, as described with respect to FIG. 12.

As described with respect to FIGS. 11 and 12, there may be a plurality of heater filaments 1305, each having two heater filament contacts 1307. The heater filaments 1305 may be individually controlled to heat the packages located on the external heater to different temperatures. Additionally, separate temperature sensors may be located near each heater filament 1305, so that the temperature of each heater filament 1305 may be accurately controlled, as described with respect to FIG. 15.

Using an external heater 1201, 1301 in contact with the bottom surface of a package provides a more direct conductive heat flow than obtained by using an oven alone to heat the packages. Thus, the advantages described with respect to FIGS. 1-11 are also advantages of external heaters 1201, 1301.

An advantage is that the heaters herein described with respect to FIG. 1-13 may be used alone or in combination with an oven to heat the packages. In this embodiment, the oven could provide supplemental heat to raise the temperature of the die. Therefore, the heater may have a maximum heating capacity of less than the desired heat-testing temperature. Alternatively, the oven may be used in conjunction with the heater to raise the temperature of the die to a higher temperature than the oven alone could attain. By using the oven in conjunction with the local heater, a standard oven or a standard heater filament may be used for devices that required different amounts of heat to reach the desired temperatures. This provides advantages similar to those obtained using only a local heater, such as reduced energy requirements, reduced temperature stress on equipment, the ability to vary the heat testing temperature for individual die, and the ability to remove individual die from a package by heating the die attach material.

Figure 14:
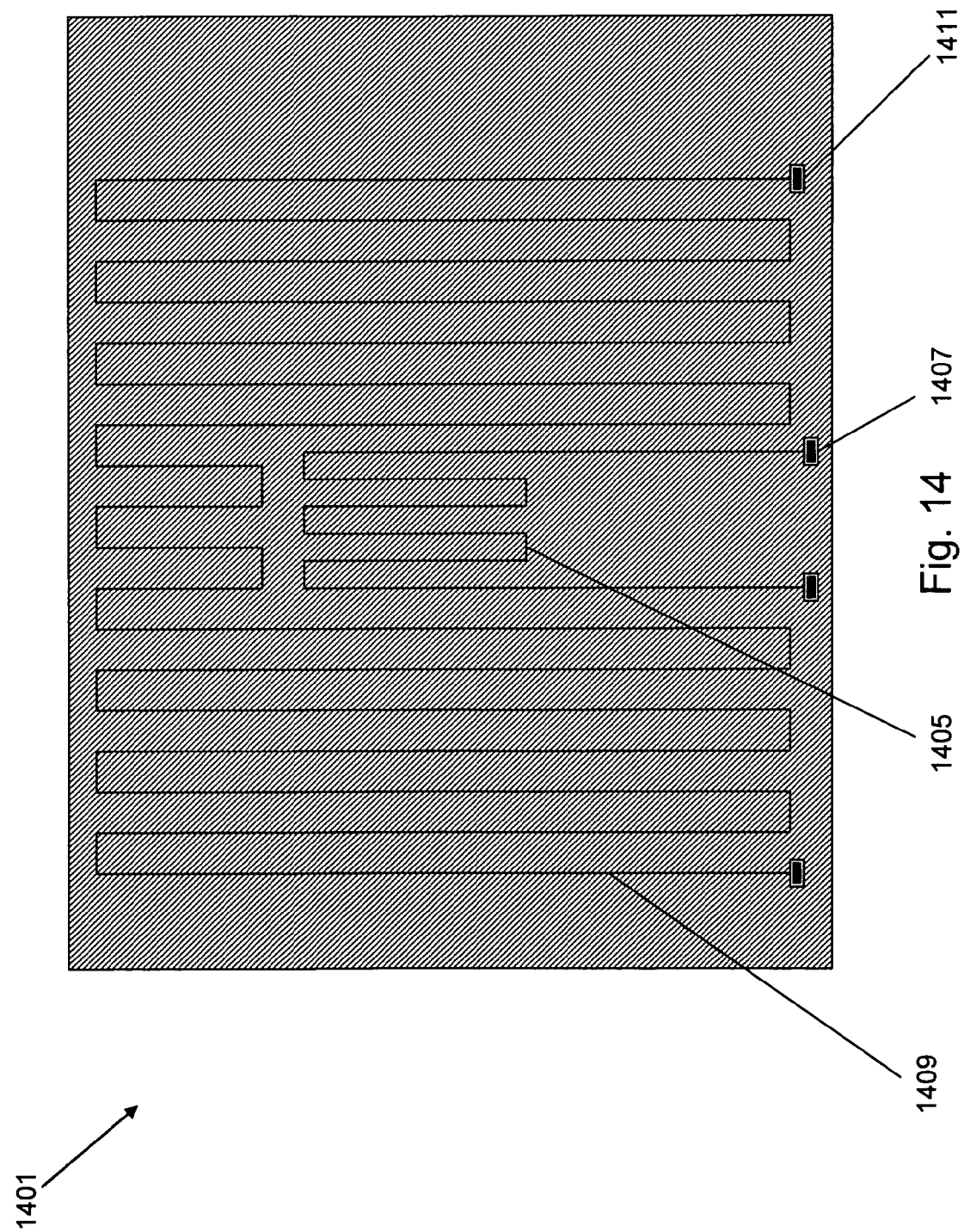
FIG. 14 is a top view of a layer of an integrated circuit package having a temperature sensor and a heater filament, according to an example.

Referring to FIG. 14, a heater layer 1401 having a temperature sensor 1405 and a heater filament 1409 may be located within the package base. The temperature sensor 1405 may be a resistive temperature sensor that is screen-printed on one of the layers. The temperature sensor 1405 is shown in FIG. 14 having a serpentine shape; however, the temperature sensor 1405 may be any shape. The temperature sensor 1405 may be composed of any metal or metal compound known in the art for resistive temperature thermistors, for example, platinum, molybdenum, tungsten, palladium oxide, or other metal oxide. The ends 1407 of the temperature sensor 1405 and the ends 1411 of the heater filament 1409 may be electrically connected to the leads of the heater layer 1401 by forming electrical connections in the heater layer 1401. The temperature sensor 1405 may be located anywhere within the package. However, locating the temperature sensor 1405 close to the top of the package base, as close as possible to the die, may allow the temperature of the die to be more accurately estimated.

Referring to FIG. 15, a heater layer 1501 may have multiple die attach sites 1503 having a temperature sensor 1405 and a heater filament 1409 located within the package base, and formed as described with respect to FIG. 14. The temperature of the die may be estimated from the temperature sensor 1405 and the voltage applied to each heater filament 1409 may be varied to obtain the desired temperature for a die located near the die attach site 1503.

It should be understood that the illustrated embodiments are examples only and should not be taken as limiting the scope of the present invention. The claims should not be read as limited to the described order or elements unless stated to that effect. Therefore, all embodiments that come within the scope and spirit of the following claims and equivalents thereto are claimed as the invention.

We claim:

1. A package for receiving at least one integrated circuit die, the package comprising:
    a plurality of stacked layers each comprising a ceramic material, wherein the plurality of layers are stacked to form electrical connections within the package,
    wherein at least one of the plurality of stacked layers comprises a heater layer, wherein the heater layer comprises a ceramic material, and at least one resistive heating filament printed onto the ceramic material of the heater layer,
    wherein the resistive heating filament has two ends configured to receive a voltage, and
    wherein the two ends are electrically connected to leads of the package; and
    at least one temperature sensor,
    wherein the at least one temperature sensor comprises a resistive temperature thermistor,
    wherein the at least one temperature sensor is printed onto at least one of the plurality of stacked layers of the package,
    wherein the at least one temperature sensor has two ends configured to receive a voltage, and
    wherein the two ends are electrically connected to leads of the package.

2. The package of claim 1, wherein the at least one resistive heating filament in the heater layer has a serpentine pattern.

3. The package of claim 1, wherein the at least one temperature sensor has a serpentine pattern.

4. The package of claim 1, wherein the at least one temperature sensor and the at least one resistive heating filament are the same filament, and wherein a resistivity of the at least one resistive heating filament is measured to estimate a temperature of the heater layer.

5. The package of claim 1, further comprising:
    a plurality of resistive heating filaments located in the heater layer, wherein each resistive heating element heats at least one respective die located inside the package, wherein each of the resistive heating filaments has two ends for receiving a voltage, and wherein the ends are electrically connected to leads of the package.

6. The package of claim 5, further comprising:
    a plurality of temperature sensors located in the heater layer, wherein each of the temperature sensors has two ends for receiving a voltage, and wherein the at least two ends are electrically connected to leads of the package, wherein outputs from each of the plurality of temperature sensors are used estimate a temperature of at least one respective die located inside the package.

7. The package of claim 1,
    wherein an output from the at least one temperature sensor is used to estimate the temperature of at least one die located inside the package, and
    wherein the voltage applied to the ends of the at least one resistive heating filament is varied in response to the estimated temperature of the at least one die located inside the package.

8. The package of claim 6,
    wherein the voltage applied to the resistive heating filament that heats the area surrounding at least one of the plurality of die located inside the package is varied in response to the estimated temperature of at least one of a plurality of die located inside the package.

9. The package of claim 1, further comprising:
    at least one die located inside the package, wherein the at least one integrated circuit die is tested at or after the time the at least one die is heated by the at least one resistive heating filament.

10. The package of claim 1, further comprising a testing component configured to test the integrated circuit die,
    wherein the heater layer is configured to apply a voltage to the ends of the at least one resistive heating filament to a temperature at which a material used to attach at least one faulty integrated circuit die to the ceramic layer is weakened when the testing component determines the at least one faulty integrated circuit die is faulty in order to remove the at least one faulty integrated circuit die from the package.

11. The package of claim 1,
    wherein the package is placed in an oven, and
    wherein the oven supplies additional heat to heat the at least one die.

12. A method of heating at least one integrated circuit die in a package, the method comprising:
    providing a package comprising:
        a plurality of layers each comprising a ceramic material,
        wherein at least one of the plurality of layers comprises a heater layer comprising a ceramic material and at least one resistive heating filament printed onto the ceramic material of the heater layer, wherein the at least one resistive heating filament has two ends electrically connected to leads of the package,
        wherein the plurality of layers are stacked to form electrical connections within the package, and
        at least one temperature sensor,
        wherein the at least one temperature sensor comprises a resistive temperature thermistor,
        wherein the at least one temperature sensor is printed onto at least one of the plurality of stacked layers of the package,
        wherein the at least one temperature sensor has two ends configured to receive a voltage, and
        wherein the two ends are electrically connected to leads of the package;
    providing a voltage to the ends of the at least one resistive heating filament to heat the integrated circuit die;

providing a voltage across the ends of the at least one temperature sensor to estimate the temperature of the integrated circuit die; and varying the voltage applied to the at least one resistive heating filament in response to the temperature estimated by the at least one temperature sensor.

13. The method of claim 12, further comprising:

determining that at least one integrated circuit die is faulty;

in response to determining that at least one integrated circuit die is faulty, applying a voltage to the ends of the at least one resistive heating filament that heats the area surrounding the at least one faulty integrated circuit die to heat the at least one faulty integrated circuit die to a temperature at which a material used to attach the at least one faulty integrated circuit die to the ceramic layer is weakened; and removing the at least one faulty integrated circuit die is from the package.

14. The method of claim 12, further comprising:

placing the package in an oven, wherein the oven supplies additional heat to heat the at least one die.

15. A method of heating at least one integrated circuit die, the method comprising:

providing a package for receiving at least one integrated circuit die, the package comprising a plurality of stacked ceramic layers, at least one of the plurality of stacked layers comprising a heater layer comprising:

a ceramic layer, wherein the ceramic layer of the heater layer comprises a plurality of clearance holes, wherein the clearance holes are located to allow leads of the package to be contacted through the ceramic layer of the heater layer; and a resistive heating filament printed onto the ceramic layer of the heater layer, wherein the resistive heating filament has two ends configured to receive a voltage, and wherein the two ends are electrically connected to leads on the heater layer; and providing a voltage across the leads on the heater layer.

16. The method of claim 15, further comprising printing the heating filament in a serpentine pattern.

17. The method of claim 15, further comprising estimating a temperature of an area of the heater layer by at least measuring resistivity of the resistive heating filament.

18. The method of claim 15, further comprising:

printing at least one temperature sensor onto the ceramic layer of the heater layer, wherein the at least one temperature sensor comprises a resistive temperature thermistor, wherein the at least one temperature sensor has two ends connected to leads on the heater layer.

19. The method of claim 18, further comprising providing a plurality of resistive heating filaments in the ceramic layer of the heater layer, wherein each of the plurality of resistive heating elements heats at least one respective integrated circuit die located inside the package, wherein the resistive heating filaments each have two ends connected to leads on the heater layer.

20. The method of claim 19, further comprising:

providing a voltage across the leads of the plurality of resistive heating filaments;

estimating temperature of the at least one respective integrated circuit die heated from the output of the at least one temperature sensor; and adjusting the voltage provided across the leads of at least one of the plurality of resistive heating filaments in response to the output of the at least one temperature sensor to heat the at least one respective integrated circuit die to a predetermined temperature.

* * * * *